United States Patent
Chen

(10) Patent No.: US 8,625,282 B2
(45) Date of Patent: Jan. 7, 2014

(54) PORTABLE ELECTRONIC DEVICE WITH HEAT SINK ASSEMBLY

(75) Inventor: Hao Chen, Shenzhen (CN)

(73) Assignees: Shenzhen Futaihong Precision Industry Co., Ltd., Shenzhen (CN); Chi Mei Communication Systems, Inc., New Taipei (TW)

( * ) Notice: Subject to any disclaimer, the term of this patent is extended or adjusted under 35 U.S.C. 154(b) by 121 days.

(21) Appl. No.: 13/328,053

(22) Filed: Dec. 16, 2011

(65) Prior Publication Data
US 2013/0107459 A1     May 2, 2013

(30) Foreign Application Priority Data
Oct. 31, 2011   (CN) .......................... 2011 2 0423212

(51) Int. Cl.
*H05K 7/20*     (2006.01)

(52) U.S. Cl.
USPC ............... 361/704; 361/679.46; 361/679.54; 361/710; 361/711

(58) Field of Classification Search
USPC .......... 361/679.46, 679.47, 679.54, 704, 709, 361/710, 711
See application file for complete search history.

(56) References Cited

U.S. PATENT DOCUMENTS

| | | | |
|---|---|---|---|
| 6,424,533 B1* | 7/2002 | Chu et al. | 361/719 |
| 7,236,364 B2* | 6/2007 | Lee | 361/701 |
| 7,903,409 B2* | 3/2011 | Patel et al. | 361/700 |
| 7,965,514 B2* | 6/2011 | Hill et al. | 361/707 |
| 2004/0132503 A1* | 7/2004 | Chiu | 455/575.1 |
| 2010/0050658 A1* | 3/2010 | Ali | 62/3.2 |
| 2010/0315399 A1* | 12/2010 | Jacobson et al. | 345/211 |
| 2012/0044635 A1* | 2/2012 | Rothkopf et al. | 361/679.54 |

OTHER PUBLICATIONS

Wikipedia, Thermoelectric cooling, Sep. 12, 2007, pp. 1-2.*

* cited by examiner

*Primary Examiner* — Anatoly Vortman
*Assistant Examiner* — Jacob Crum
(74) *Attorney, Agent, or Firm* — Altis Law Group, Inc.

(57) ABSTRACT

A portable electronic device includes a housing, a radiating assembly, a display, a battery, and a heat sink assembly. The housing includes a front portion and a back portion opposite to the front portion. Both the radiating assembly, the display, the battery, and heat sink assembly are received in the housing. The heat sink assembly is a semiconductor cooling plate, and dissipates heat from the radiating assembly out of the housing.

5 Claims, 2 Drawing Sheets

PORTABLE ELECTRONIC DEVICE WITH HEAT SINK ASSEMBLY

BACKGROUND

1. Technical Field

This exemplary disclosure generally relates to portable electronic devices, and particularly to a portable electronic device with a heat sink assembly.

2. Description of Related Art

Motherboards for portable electronic devices can radiate much heat. In multi-layer boards, the heat can be dissipated by copper ground layers of the motherboard. However, this configuration has limited effect, especially when the motherboard operates for long uninterrupted periods.

Therefore, there is room for improvement within the art.

BRIEF DESCRIPTION OF THE DRAWINGS

Many aspects of the portable electronic device can be better understood with reference to the following drawings. The components in the drawings are not necessarily drawn to scale, the emphasis instead being placed contacting clearly illustrating the principles of the heat sink.

DETAILED DESCRIPTION

Figure 1:
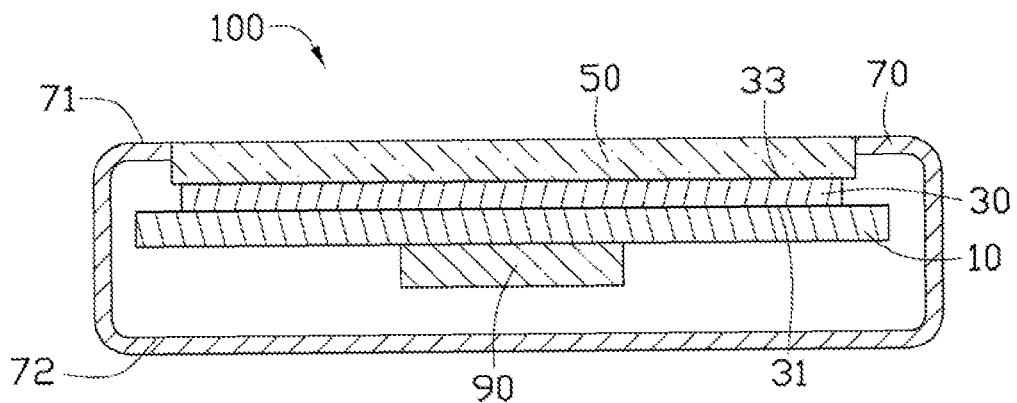
FIG. 1 is a cross-section view of a portable electronic device according to a first embodiment.

FIG. 1 is a cross-section view of a portable electronic device 100 according to a first embodiment. The portable electronic device 100 includes a radiating assembly 10, a heat sink assembly 30, a display 50, a housing 70, and a battery 90. The display 50, the heat sink assembly 30, the radiating assembly 10, and the battery 90 are received in the housing 70, and all are assembled together from the top down in that order. The housing 70 includes a front portion 71 where the display 50 is located and viewable, and a back portion 72 opposite to the front portion 71.

The radiating assembly 10 can be a motherboard. The heat sink assembly 30 is a semiconductor cooling plate, for example, a Peltier cooling plate. The heat sink assembly 30 includes a cooling surface 31 and a heating surface 33 opposite to the cooling surface 31. When the heat sink assembly 30 is power on, heat from the cooling surface 31 is conducted to the heating surface 33, cooling the cooling surface 31 and simultaneously heating the heating surface 33. The cooling surface 31 contacts the radiating assembly 10, and the heating surface 33 contacts the display 50.

The display 50 or some part of the display 50 is made of material which effectively conducts heat.

Thus, the cooling surface 31 absorbs heat radiated from the radiating assembly 10, and then conducts the heat to the heating surface 33. Then the heating surface 33 conducts heat through the display 50 to the outside from the front of the device 100.

Figure 2:
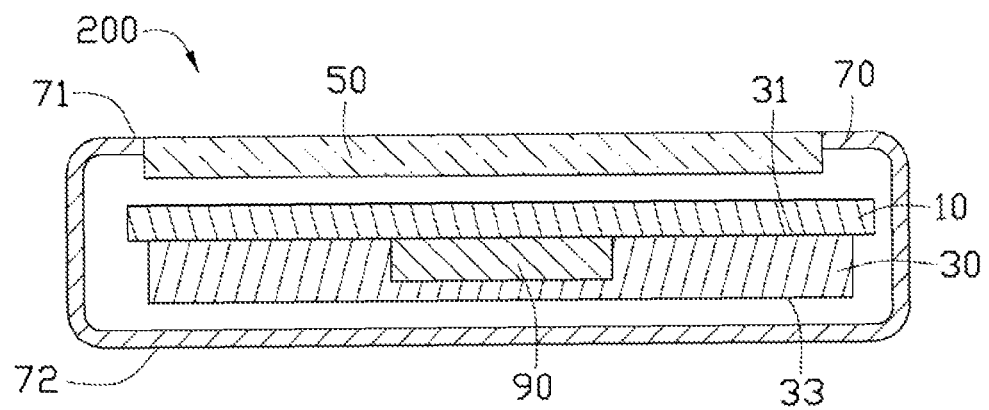
FIG. 2 is a cross-section view of a portable electronic device according to a second embodiment.

FIG. 2 shows a portable electronic device 200 according to a second exemplary embodiment. The portable electronic device 200 differs from the device 100 in that the components are placed to radiate the heat out from the back rather than the front. The display 50 is still located on the front portion, the battery 90 is still located below the radiating assembly 10, but the heat sink assembly 30 is located below the radiating assembly 10, and receives the battery 90. The cooling surface 31 of the heat sink assembly 30 contacts the radiating assembly 10, the heating surface 33 faces the back portion 72 of the housing 70. Thus, although the surface of the battery 90 cannot effectively conduct heat, heat from the radiating assembly 10 is absorbed by the cooling surface 31, and conducts the heat to the heating surface 33. Then the heating surface 33 conducts heat out of the device 200 from the back.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A portable electronic device comprising:
   a housing comprising a front portion and a back portion opposite to the front portion;
   a radiating assembly received in the housing;
   a display located on the front portion and contacting the radiating assembly;
   a battery positioned below the radiating assembly; and
   a heat sink assembly being a semiconductor cooling plate, received in the housing and configured for dissipating heat from the radiating assembly;
   wherein the heat sink assembly includes a cooling surface and a heating surface opposite to the cooling surface, the battery is surrounded by the heat sink assembly, a top surface of the battery is coplanar with the cooling surface, the top surface and the cooling surface together contact one side of the radiating assembly, the heating surface faces the back portion, heat from the radiating assembly is conducted through the cooling surface and the heating surface out of the device from the back of the device.

2. The device of claim 1, wherein the heat sink assembly defines a groove having a plurality walls, the battery is received in the groove, and contacts each wall of the groove.

3. The device of claim 2, wherein the groove extends toward the heating surface from the cooling surface.

4. A portable electronic device comprising:
   a housing, comprising a front portion and a back portion opposite to the front portion;
   a radiating assembly received in the housing;
   a battery positioned on the radiating assembly; and
   a heat sink assembly being a semiconductor cooling plate, received in the housing and configured for dissipating heat from the radiating assembly;
   wherein the heat sink assembly includes a cooling surface and a heating surface opposite to the cooling surface, the battery is surrounded by the heat sink assembly, a top surface of the battery is coplanar with the cooling surface, the top surface and the cooling surface together contact one side of the radiating assembly, the heating surface faces the back portion, heat from the radiating assembly is conducted through the cooling surface and the heating surface out of the device from the back.

5. The device of claim 4, further comprises a display, wherein the display is positioned contacting the radiating assembly, the battery is positioned below the radiating assembly.

* * * * *